(12) United States Patent
Liu et al.

(10) Patent No.: US 11,774,497 B2
(45) Date of Patent: Oct. 3, 2023

(54) ISOLATION CIRCUIT HAVING TEST MECHANISM AND TEST METHOD THEREOF

(71) Applicant: REALTEK SEMICONDUCTOR CORPORATION, Hsinchu (TW)

(72) Inventors: Kuo-Kai Liu, Hsinchu (TW); Chih-Chieh Cheng, Hsinchu (TW); Pei-Ying Hsueh, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 91 days.

(21) Appl. No.: 17/501,069

(22) Filed: Oct. 14, 2021

(65) Prior Publication Data
US 2022/0120812 A1  Apr. 21, 2022

(30) Foreign Application Priority Data

Oct. 19, 2020 (TW) .................................. 109136174

(51) Int. Cl.
*G01R 31/3185* (2006.01)
*G01R 31/28* (2006.01)

(52) U.S. Cl.
CPC . *G01R 31/318544* (2013.01); *G01R 31/2853* (2013.01)

(58) Field of Classification Search
CPC ............... G01R 31/318544; G01R 31/2853
See application file for complete search history.

(56) References Cited

U.S. PATENT DOCUMENTS

2015/0303900 A1* 10/2015 Wang ............. G01R 31/318536
327/198
2018/0164376 A1* 6/2018 Ge .................... G01R 31/31721

* cited by examiner

*Primary Examiner* — Son T Le
*Assistant Examiner* — Brian Butler Geiss
(74) *Attorney, Agent, or Firm* — WPAT, PC

(57) ABSTRACT

The present invention discloses an isolation circuit having test mechanism. An isolation circuit component performs signal transmission when a signal that a control terminal receives has an enabling state and performs signal isolation when the signal has a disabling state. The test circuit includes a multiplexer and a control circuit. Under a shifting operation state in a test mode, the control circuit controls the multiplexer to select an operation input terminal to receive and output an isolation control signal having the enabling state to the control input terminal. Under a capturing operation state in the test mode, the control circuit controls the multiplexer to select a test input terminal to receive and output the test signal to the control input terminal. The control circuit further determines whether the isolation circuit performs signal transmission or signal isolation according to the signals at the data input terminal and the data output terminal.

10 Claims, 2 Drawing Sheets

ISOLATION CIRCUIT HAVING TEST MECHANISM AND TEST METHOD THEREOF

BACKGROUND OF THE INVENTION

1. Field of the Invention

The present invention relates to an isolation circuit having test mechanism and an isolation circuit test method thereof.

2. Description of Related Art

Before integrated circuits (IC) are finished manufacturing, a scan test is performed through a scan chain by using scan test sequences having high fault coverage. The defected chips can be removed accordingly. Such a test technology can find out most of the defects in the circuits.

In the circuits having a low power design, an isolation circuit component is disposed to be used to isolate the circuits within different power domains to prevent the circuits in the power-on domain affected by the circuits in the power-off domain. However, in conventional scan test, all the power domains are required to be turned on and the isolation circuit component is set to be turned on. As a result, the scan chain is not able to perform a thorough test on the isolation circuit component.

SUMMARY OF THE INVENTION

In consideration of the problem of the prior art, an object of the present invention is to supply isolation circuit having test mechanism and an isolation circuit test method thereof.

The present invention discloses an isolation circuit having test mechanism that includes an isolation circuit component and a test circuit. The isolation circuit component includes a control input terminal, a data input terminal and a data output terminal, and is configured to perform signal transmission between the data input terminal and the data output terminal when a signal that the control input terminal receives has an enabling state, and perform signal isolation between the data input terminal and the data output terminal when the signal that the control input terminal receives has a disabling state. The test circuit includes a multiplexer and a control circuit. The multiplexer includes an operation input terminal, a test input terminal and a control output terminal. Under a shifting operation state of a test mode, the control circuit controls the multiplexer to select the operation input terminal to receive an isolation control signal having the enabling state and outputs the isolation control signal to the control input terminal of the isolation circuit component through the control output terminal. Under a capturing operation state in the test mode, the control circuit controls the multiplexer to select the test input terminal to receive a test signal having either the enabling state or the disabling state and output the test signal to the control input terminal of the isolation circuit component through the control output terminal, and the control circuit further determines whether the isolation circuit component performs signal transmission or signal isolation according to the signals at the data input terminal and the data output terminal.

The present invention also discloses an isolation circuit test method used in an isolation circuit having test mechanism that includes the steps outlined below. Under a shifting operation state of a test mode, the multiplexer is controlled by a control circuit to select the operation input terminal thereof to receive an isolation control signal having an enabling state and outputs the isolation control signal to a control input terminal of an isolation circuit component through a control output terminal thereof. Under a capturing operation state in the test mode, the multiplexer is controlled by the control circuit to select the test input terminal to receive a test signal having either the enabling state or the disabling state and output the test signal to the control input terminal of the isolation circuit component through the control output terminal. Signal transmission between a data input terminal and a data output terminal is performed by the isolation circuit component when a signal that the control input terminal receives has the enabling state. Signal isolation between the data input terminal and the data output terminal is performed by the isolation circuit component when the signal that the control input terminal receives has the disabling state. Whether the isolation circuit component performs signal transmission or signal isolation is determined according to the signals at the data input terminal and the data output terminal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an isolation circuit having test mechanism and an isolation circuit test method thereof to perform a thorough test on the signal isolation mechanism provided by the isolation circuit component.

Figure 1:
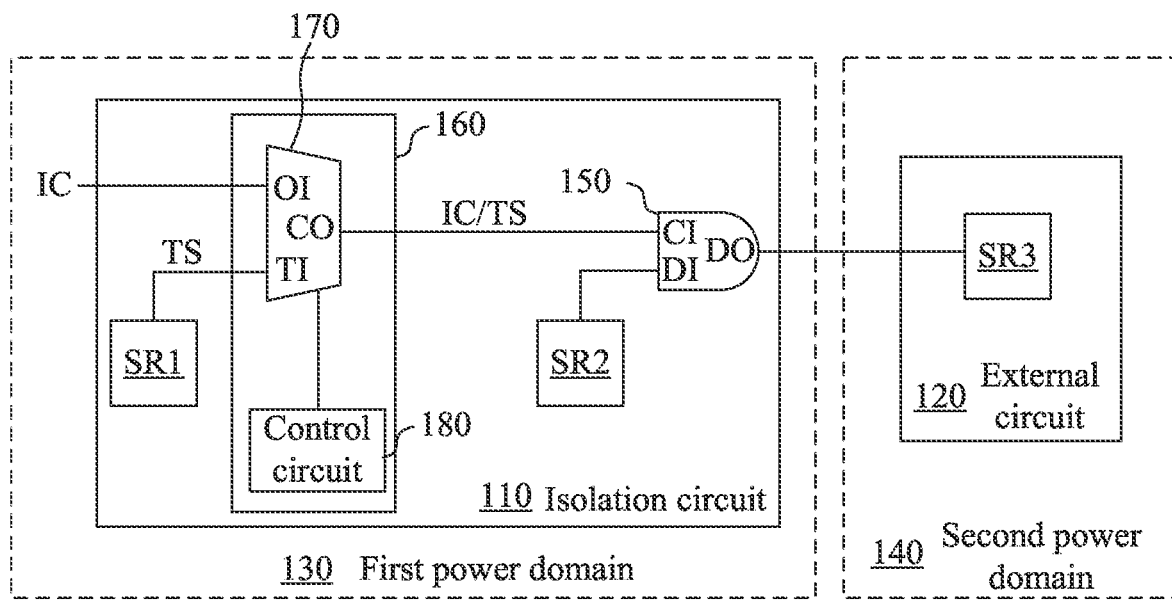
FIG. 1 illustrates a block diagram of a circuit system according to an embodiment of the present invention.

Reference is now made to FIG. 1. FIG. 1 illustrates a block diagram of a circuit system 100 according to an embodiment of the present invention. The circuit system 100 includes an isolation circuit 110 having test mechanism and an external circuit 120. The isolation circuit 110 is in a first power domain 130 and the external circuit 120 is in a second power domain 140. More specifically, the isolation circuit 110 and the external circuit 120 operate according to different powers.

The isolation circuit 110 includes an isolation circuit component 150 and a test circuit 160.

The isolation circuit component 150 includes a control input terminal CI, a data input terminal DI and a data output terminal DO. The isolation circuit component 150 is configured to perform signal transmission between the data input terminal DI and the data output terminal DO when a signal received by the control input terminal CI has an enabling state. Further, the isolation circuit component 150 is configured to perform signal isolation between the data input terminal DI and the data output terminal DO when the signal received by the control input terminal CI has a disabling state. In an embodiment, when the signal received by the control input terminal CI has the disabling state, the isolation circuit component 150 keeps the data output terminal DO to continuously output a predetermined state.

In an embodiment, the isolation circuit component 150 is a logic gate. For example, the isolation circuit component 150 is such as, but not limited to an AND gate. Under such a condition, the enabling state is a high state and the disabling state is a low state.

More specifically, when the signal received by the control input terminal CI has the high state (enabling state), the input of the data input terminal DI of the isolation circuit component 150 is the same as the output of the data output terminal DO. When the signal received by the control input terminal CI has the low state (disabling state), the data output terminal DO of the isolation circuit component 150 keeps outputting the low state. The output of the data output terminal DO is irrelevant to the input of the data input terminal DI.

In practical applications, under the operation mode, the power of the first power domain 130 and the second power domain 140 are both enabled. Under such a condition, the isolation circuit component 150 of the isolation circuit 110 can be controlled by the signal having the enabling state to be operated under a non-signal isolation state, to perform signal transmission between the data input terminal DI and the data output terminal DO.

However, in some usage scenarios under the operation mode, the power of the first power domain 130 is disabled to form a power-off domain and the power of the second power domain 140 is still enabled to form a power-on domain. Under such a condition, in order to prevent the circuit in the first power domain 130 from outputting uncertain voltage, the isolation circuit component 150 of the isolation circuit 110 can be controlled by the signal having the disabling state to be operated under a signal isolation state, to perform signal isolation between the data input terminal DI and the data output terminal DO and output a predetermined state.

By using the test circuit 160, the isolation circuit 110 can perform a thorough test on the isolation circuit component 150 in the test mode. The configuration and operation of the test circuit 160 is described in detail in the following paragraphs.

The test circuit 160 includes a multiplexer 170 and a control circuit 180.

The multiplexer 170 includes an operation input terminal OI, a test input terminal TI and a control output terminal CO. The control circuit 180 is configured to control the multiplexer 170 to select different input terminals, under different states of the test mode, to perform the signal transmission of different signals such that a test can be performed.

In an embodiment, in order to perform test on each of the circuits in the circuit system 100, the circuit system 100 includes a scan chain (not illustrated in the figure) and the scan chain includes a plurality of shift registers to feed test data to the input terminal of each of the circuits.

For example, the test input terminal TI of the multiplexer 170 is electrically coupled to a first shift register SR1. The data input terminal DI of the isolation circuit component 150 is electrically coupled to a second shift register SR2. The data output terminal DO of the isolation circuit component 150 is electrically coupled to a third shift register SR3 disposed in the external circuit 120. Each of the first shift register SR1, the second shift register SR2 and the third shift register SR3 is a part of the scan chain. However, other shift registers may be disposed between each two of the shift registers. The first shift register SR1, the second shift register SR2 and the third shift register SR3 are not necessarily disposed next to each other.

Under a shifting operation state of the test mode, the scan chain performs data shifting such that the data shifts among the shift registers. Under such a condition, the control circuit 180 controls the multiplexer 170 to select the operation input terminal OI to receive an isolation control signal IC having the enabling state, and outputs the isolation control signal IC to the control input terminal CI of the isolation circuit component 150 through the control output terminal CO. The isolation control signal IC may be generated from another circuit (not illustrated in the figure) that cooperates with the control circuit 180 such that such a circuit generates the corresponding isolation control signal IC when the control circuit 180 controls the multiplexer 170 to select the operation input terminal OI.

As a result, the control input terminal CI of the isolation circuit component 150 receives the isolation control signal IC having the enabling state such that the test data in the second shift register SR2 can be transmitted to the third shift register SR3 through the data input terminal DI and the data output terminal DO.

Under a capturing operation state of the test mode, the scan chain performs data driving such that the data drives the corresponding circuit. Under such a condition, the control circuit 180 controls the multiplexer 170 to select the test input terminal TI to receive the test signal TS having either the enabling state or the disabling state, and output the test signal TS to the control input terminal CI of the isolation circuit component 150 through the control output terminal CO. In an embodiment, the test signal TS is from the test data in the first shift register SR1.

As a result, the control input terminal CI of the isolation circuit component 150 receives the test signal TS having either the enabling state or the disabling state. By checking the data values stored in the second shift register SR2 and third shift register SR3 that are respectively electrically coupled to the data input terminal DI and the data output terminal DO, the signals at the data input terminal DI and the data output terminal DO can be compared to verify whether the isolation circuit component 150 performs signal transmission or signal isolation correctly. The test can be accomplished.

It is appreciated that in the test mode, the shifting operation state and the capturing operation state are operated in an interlaced manner until all the test patterns are fed to the scan chain.

The above description of the operation of the multiplexer 170 and the control circuit 180 is made based on the test mode. In the operation mode, the control circuit 180 can make the multiplexer 170 keep selecting the operation input terminal OI to receive the isolation control signal IC having either the enabling state or the disabling state to accomplish the ordinary signal transmission and signal isolation mechanism.

In some approaches, the isolation circuit component 150 can only perform test on the path between the data input terminal DI and the data output terminal DO and can not perform test to verify whether the control input terminal CI of the isolation circuit component 150 operates correctly. By disposing the test circuit 160 in the isolation circuit 110 of the present invention, the test can be performed on the control input terminal CI of the isolation circuit component 150 to make sure the signal isolation mechanism of the isolation circuit component 150 operates correctly.

Figure 2:
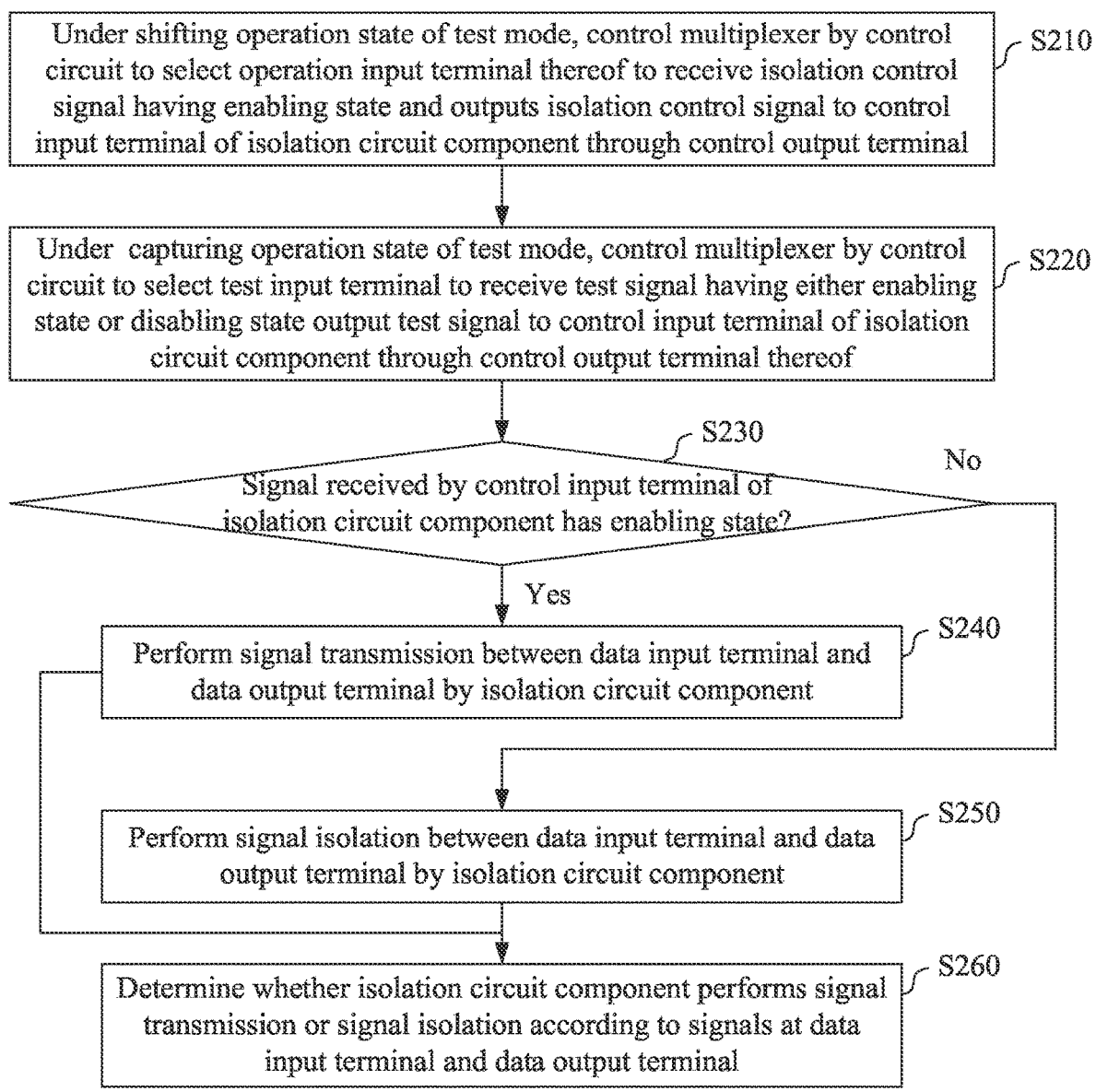
FIG. 2 illustrates a flow chart of an isolation circuit test method according to an embodiment of the present invention.

Reference is now made to FIG. 2. FIG. 2 illustrates a flow chart of an isolation circuit test method 200 according to an embodiment of the present invention.

In addition to the apparatus described above, the present disclosure further provides the isolation circuit test method 200 that can be used in such as, but not limited to, the isolation circuit 110 in FIG. 1. As illustrated in FIG. 2, an embodiment of the isolation circuit test method 200 includes the following steps.

In step S210, under the shifting operation state of the test mode, the multiplexer 170 is controlled by the control circuit 180 to select the operation input terminal OI thereof to receive the isolation control signal IC having the enabling state and outputs the isolation control signal IC to the control input terminal CI of the isolation circuit component 150 through the control output terminal CO thereof.

In step S220, under the capturing operation state in the test mode, the multiplexer 170 is controlled by the control circuit 180 to select the test input terminal TI to receive the test signal TS having either the enabling state or the disabling state and output the test signal TS to the control input terminal CI of the isolation circuit component 150 through the control output terminal CO thereof.

In step S230, whether the signal received by the control input terminal CI of the isolation circuit component 150 has the enabling state is determined.

In step S240, signal transmission between the data input terminal DI and the data output terminal DO is performed by the isolation circuit component 150 when the signal that the control input terminal CI receives has the enabling state.

In step S250, signal isolation between the data input terminal DI and the data output terminal DO is performed by the isolation circuit component 150 when the signal that the control input terminal CI receives has the disabling state.

In step S260, whether the isolation circuit component 150 performs signal transmission or signal isolation is determined according to the signals at the data input terminal DI and the data output terminal DO.

It is appreciated that the embodiments described above are merely an example. In other embodiments, it should be appreciated that many modifications and changes may be made by those of ordinary skill in the art without departing, from the spirit of the invention.

In summary, the isolation circuit having test mechanism and the test method thereof can perform a thorough test on the signal isolation mechanism provided by the isolation circuit component.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. An isolation circuit having test mechanism, comprising:
    an isolation circuit component comprising a control input terminal, a data input terminal and a data output terminal, and configured to perform signal transmission between the data input terminal and the data output terminal when a signal that the control input terminal receives has an enabling state, and perform signal isolation between the data input terminal and the data output terminal when the signal that the control input terminal receives has a disabling state; and
    a test circuit comprising:
        a multiplexer comprising an operation input terminal, a test input terminal and a control output terminal; and
        a control circuit;

wherein under a shifting operation state of a test mode, the control circuit controls the multiplexer to select the operation input terminal to receive an isolation control signal having the enabling state and outputs the isolation control signal to the control input terminal of the isolation circuit component through the control output terminal;
    under a capturing operation state in the test mode, the control circuit controls the multiplexer to select the test input terminal to receive a test signal having either the enabling state or the disabling state and output the test signal to the control input terminal of the isolation circuit component through the control output terminal, and the control circuit further determines whether the isolation circuit component performs one of signal transmission and signal isolation according to the signals at the data input terminal and the data output terminal.

2. The isolation circuit of claim 1, wherein the test input terminal of the multiplexer is electrically coupled to a first shift register of a scan chain to receive an input from the first shift register, and the data input terminal is electrically coupled to a second shift register of the scan chain to receive an input from the second shift register;
    wherein the scan chain performs data shifting under the shifting operation state and performs data driving under the capturing operation state.

3. The isolation circuit of claim 2, wherein the data output terminal electrically coupled to a third shift register disposed in an external circuit and comprised in the scan chain, and data values stored in the second shift register and third shift register is actually used to determine whether the isolation circuit component performs signal transmission or signal isolation.

4. The isolation circuit of claim 1, wherein the isolation circuit and the external circuit are respectively disposed in a first power domain and a second power domain;
    wherein under a non-signal isolation state of an operation mode, the first power domain and the second power domain are enabled and the control circuit controls the multiplexer to select the operation input terminal to receive the isolation control signal having the enabling state;
    under a signal isolation state of the operation mode, the first power domain is disabled and the second power domain is enabled and the control circuit controls the multiplexer to select the operation input terminal to receive the isolation control signal having the disabling state.

5. The isolation circuit of claim 1, wherein the isolation circuit component is a logic gate and is configured to, under the condition that the signal received by the control input terminal has the disabling state, output a predetermined state according to the disabling state.

6. An isolation circuit test method used in an isolation circuit having test mechanism, comprising:
    under a shifting operation state of a test mode, controlling the multiplexer by a control circuit to select the operation input terminal thereof to receive an isolation control signal having an enabling state and outputs the isolation control signal to a control input terminal of an isolation circuit component through a control output terminal thereof;
    under a capturing operation state in the test mode, controlling the multiplexer by the control circuit to select the test input terminal to receive a test signal having either the enabling state or the disabling state and output the test signal to the control input terminal of the isolation circuit component through the control output terminal;

performing signal transmission between a data input terminal and a data output terminal by the isolation circuit component when a signal that the control input terminal receives has the enabling state;

performing signal isolation between the data input terminal and the data output terminal by the isolation circuit component when the signal that the control input terminal receives has the disabling state;

determining whether the isolation circuit component performs one of signal transmission and signal isolation according to the signals at the data input terminal and the data output terminal.

7. The isolation circuit test method of claim 6, wherein the test input terminal of the multiplexer is electrically coupled to a first shift register of a scan chain to receive an input from the first shift register, and the data input terminal is electrically coupled to a second shift register of the scan chain to receive an input from the second shift register;

wherein the scan chain performs data shifting under the shifting operation state and performs data driving under the capturing operation state.

8. The isolation circuit test method of claim 7, wherein the data output terminal electrically coupled to a third shift register disposed in an external circuit and comprised in the scan chain, and data values stored in the second shift register and third shift register is actually used to determine whether the isolation circuit component performs signal transmission or signal isolation.

9. The isolation circuit test method of claim 6, wherein the isolation circuit and the external circuit are respectively disposed in a first power domain and a second power domain, the isolation circuit test method further comprises:

under a non-signal isolation state of an operation mode, wherein the first power domain and the second power domain are enabled, controlling the multiplexer, by the control circuit, to select the operation input terminal to receive the isolation control signal having the enabling state;

under a signal isolation state of the operation mode, wherein the first power domain is disabled and the second power domain is enabled, controlling the multiplexer, by the control circuit, to select the operation input terminal to receive the isolation control signal having the disabling state.

10. The isolation circuit test method of claim 6, wherein the isolation circuit component is a logic gate and is configured to, under the condition that the signal received by the control input terminal has the disabling state, output a predetermined state according to the disabling state.

* * * * *